(12) United States Patent
Oishi et al.

(10) Patent No.: US 8,097,473 B2
(45) Date of Patent: Jan. 17, 2012

(54) ALIGNMENT METHOD, EXPOSURE METHOD, PATTERN FORMING METHOD, AND EXPOSURE APPARATUS

(75) Inventors: Satoru Oishi, Utsunomiya (JP); Hideki Ina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/323,312

(22) Filed: Nov. 25, 2008

(65) Prior Publication Data

US 2009/0138135 A1    May 28, 2009

(30) Foreign Application Priority Data

Nov. 26, 2007    (JP) .................................. 2007-304503

(51) Int. Cl.
*H01L 21/00* (2006.01)
(52) U.S. Cl. .......... 438/5; 438/10; 438/11; 257/E21.001
(58) Field of Classification Search ................. 438/5, 11; 257/E21.001
See application file for complete search history.

(56) References Cited

U.S. PATENT DOCUMENTS

| | | | |
|---|---|---|---|
| 6,537,835 B2 * | 3/2003 | Adachi et al. .................... | 438/14 |
| 6,559,063 B2 * | 5/2003 | Minami et al. ................. | 438/737 |
| 7,033,904 B2 * | 4/2006 | Kirikoshi et al. ............. | 438/401 |

FOREIGN PATENT DOCUMENTS

| | | |
|---|---|---|
| JP | 6-151274 A | 5/1994 |
| JP | 2001-155988 A | 6/2001 |

OTHER PUBLICATIONS

"Manufacturing Challenges in Double Patterning Lithography", William Arnold et al., Manufacturing Control and Execution (MC)-233, International Symposium on Semiconductor Manufacturing (ISSM) 2006, 15th.

The New s Language: A programming Environment for Data Analysis and Graphics (R. A. Becker, J. M. Chambers, and A. R. Wilks, Kyoritsu Shuppan).

* cited by examiner

*Primary Examiner* — Angel Roman
(74) *Attorney, Agent, or Firm* — Canon USA, Inc., I.P. Division

(57) ABSTRACT

An alignment method is provided in which a substrate including first and second layers is aligned in forming a second pattern in the second layer. The method includes storing first alignment measurement data to be used in alignment performed in forming a first pattern and a second alignment mark in the second layer, the first alignment measurement data obtained by measuring a first alignment mark provided in the first layer; obtaining second alignment measurement data by measuring the second alignment mark through a resist applied over the second layer; obtaining third alignment measurement data by measuring the first alignment mark through the resist; and performing alignment of the substrate in accordance with a first difference between the first and second alignment measurement data, or in accordance with the first difference and a second difference between the first and third alignment measurement data.

17 Claims, 15 Drawing Sheets

FIG. 2
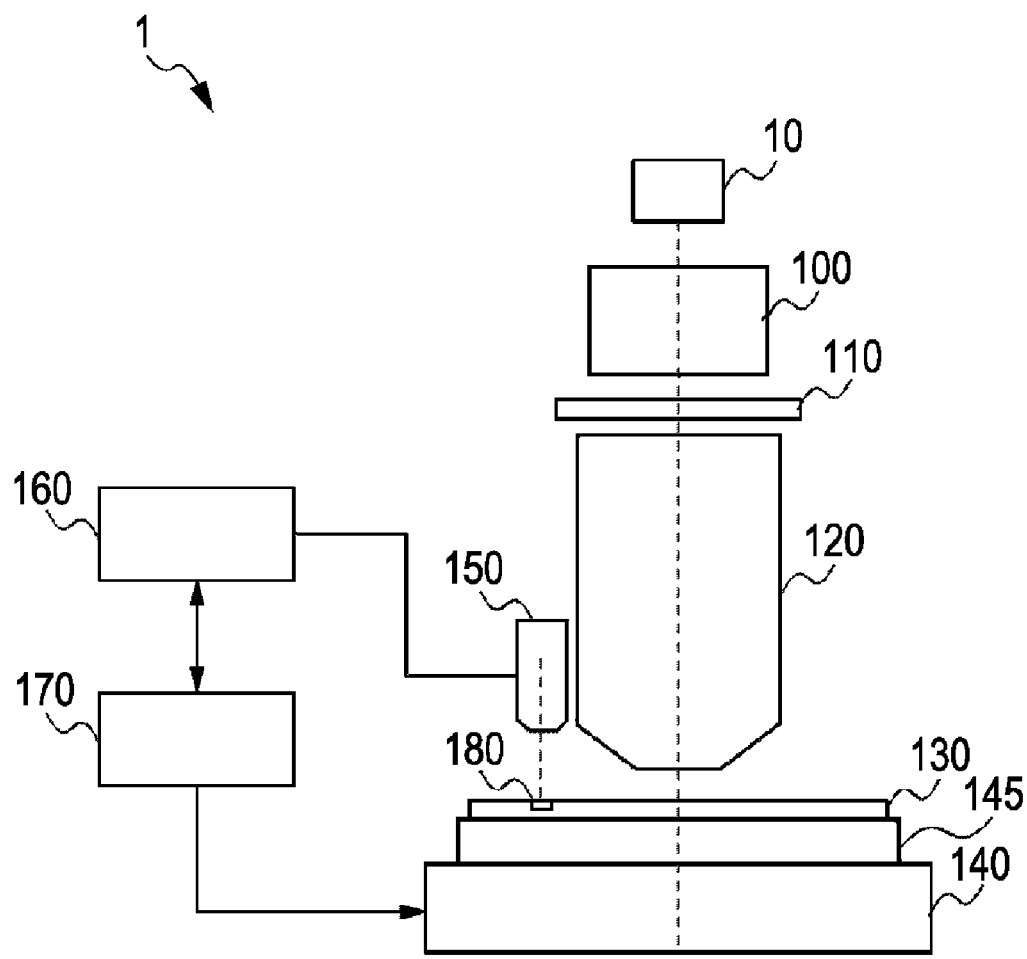
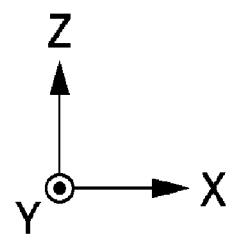

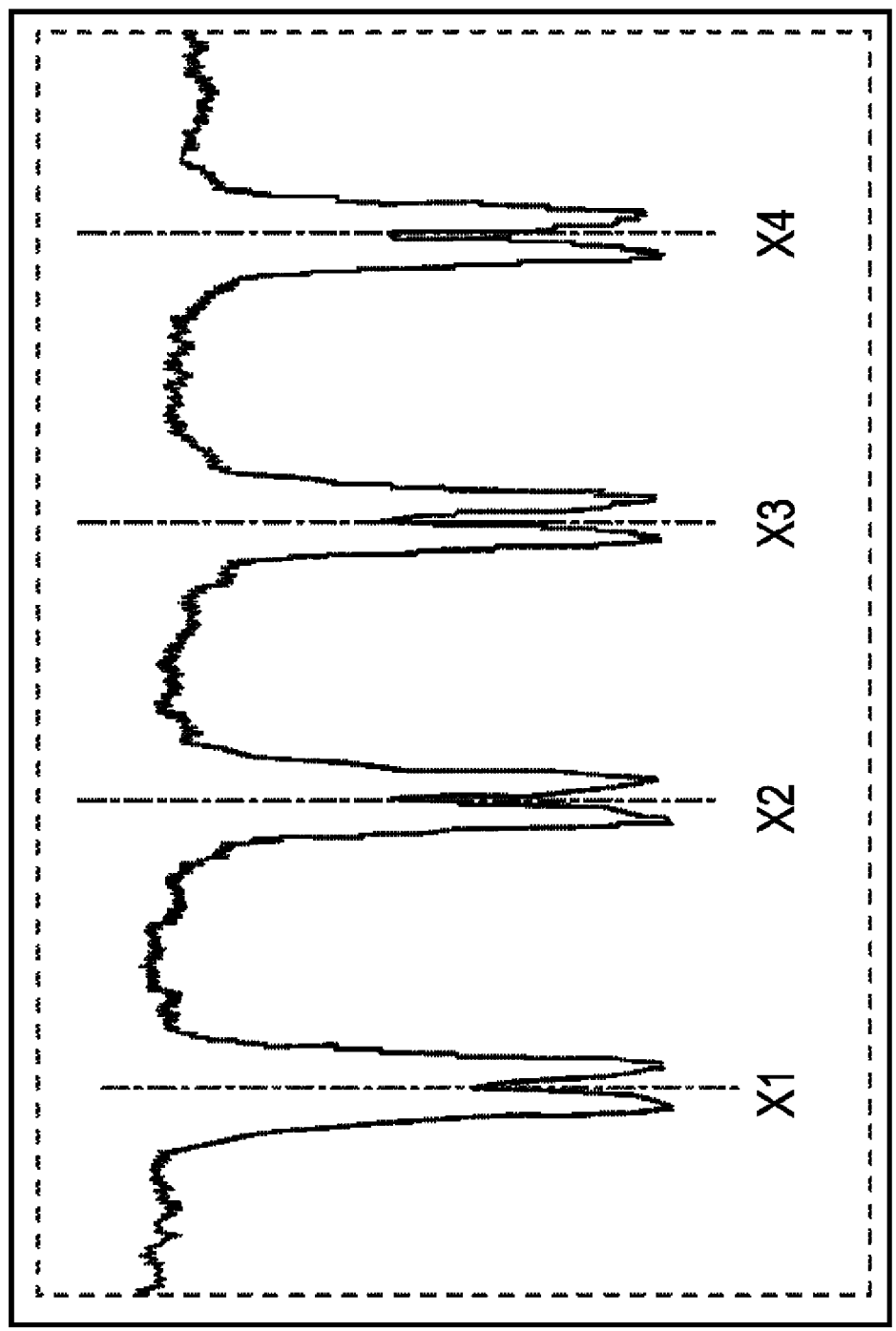

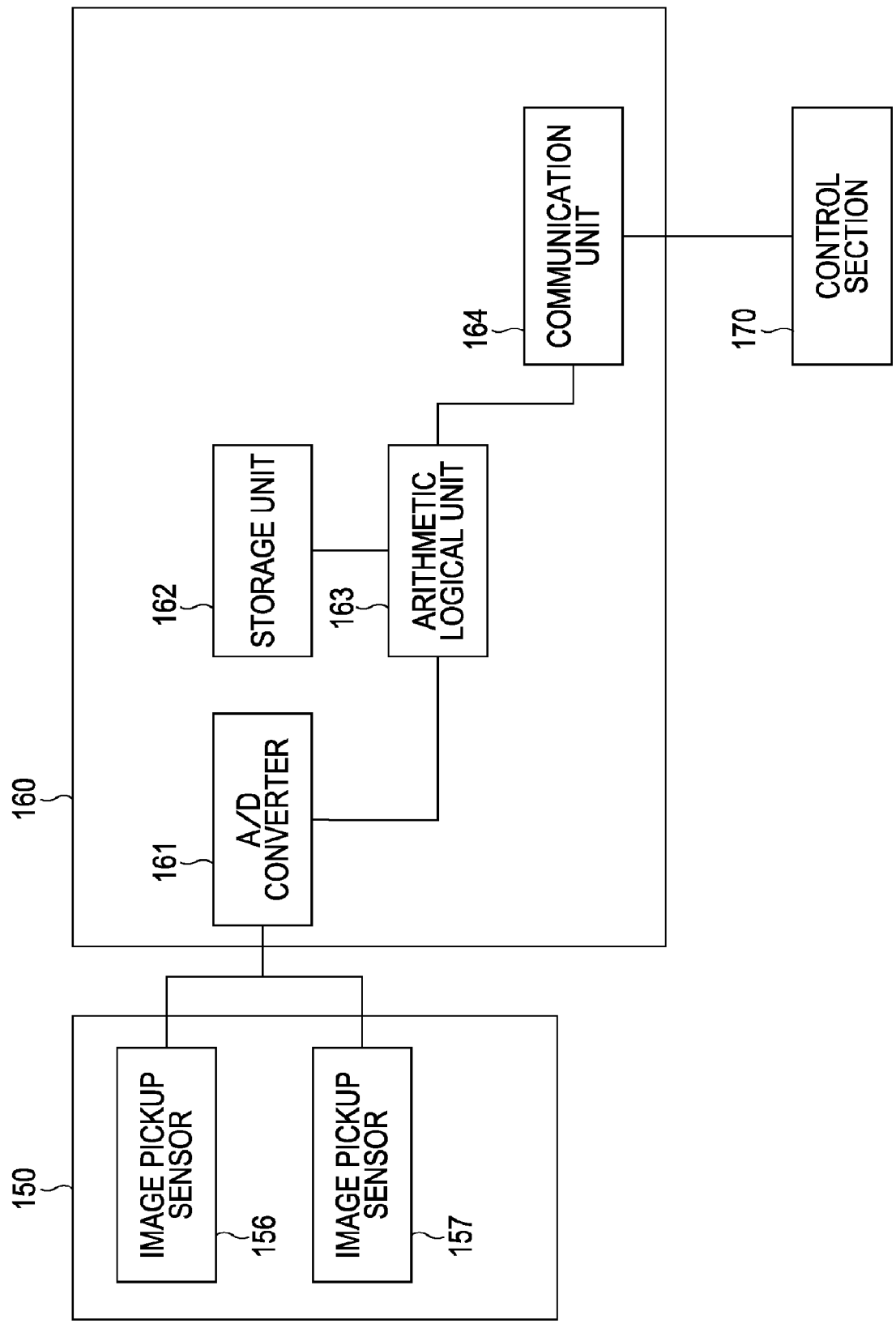

FIG. 9
FIRST EXPOSURE
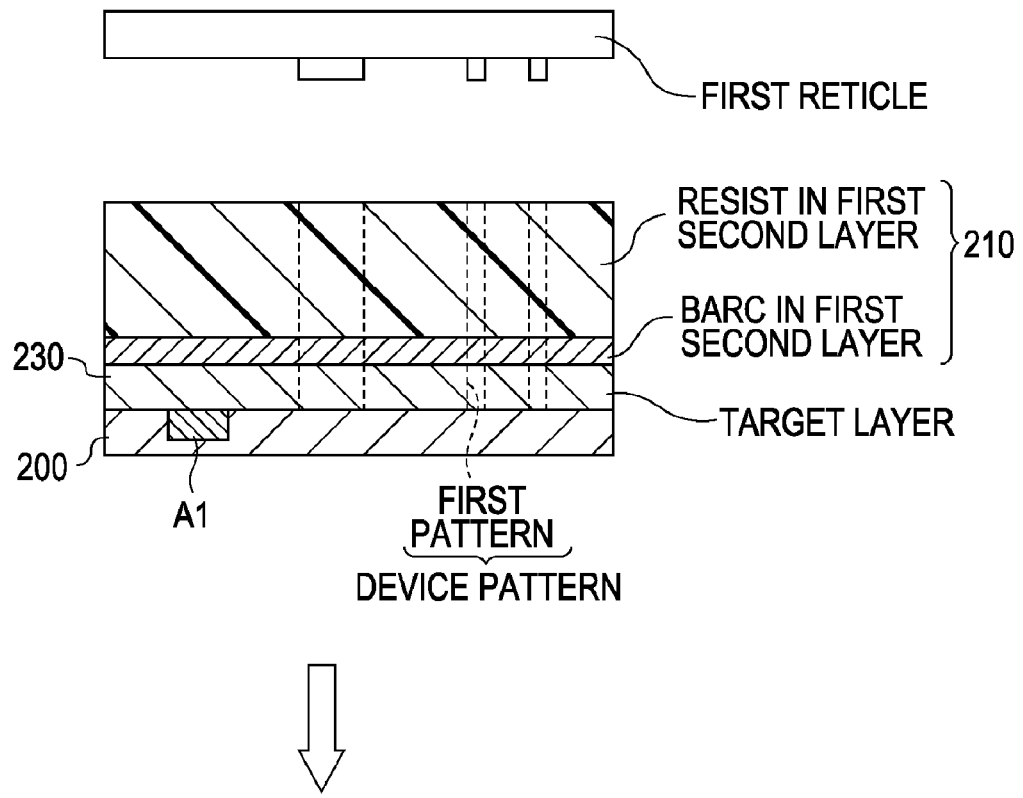
SECOND EXPOSURE
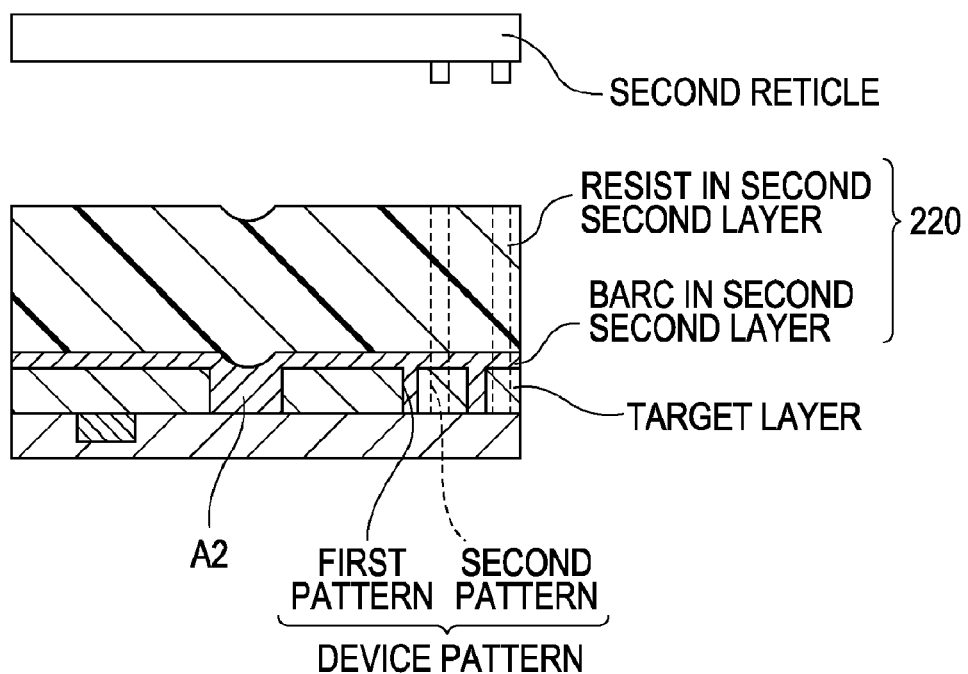

FIG. 10

|      | RESULTS OF AGA (UNIT: ppm) | | |
| --- | --- | --- | --- |
|      | $\beta x$ | $\beta y$ | $\theta x - \theta y$ |
| M12 | 0.593 | 0.492 | 0.037 |
| M01 | 0.575 | 0.483 | 0.031 |
| M02 | 0.578 | 0.487 | 0.034 |

UNIT [nm]

| | | SAMPLE SHOT NO. i | | | | | RESIDUAL VARIANCE |
|---|---|---|---|---|---|---|---|
| | | 1 | 2 | 3 | ... | 8 | |
| RESIDUAL Ri | Ri12 | 3.1 | 2.4 | 1.3 | ... | 3.5 | 2.2 |
| | Ri01 | 1.7 | 1.9 | 0.9 | ... | 2.1 | 1.3 |
| | Ri02 | 2.6 | 2.3 | 1.1 | ... | 2.2 | 1.6 |

FIG. 14
FIRST EXPOSURE
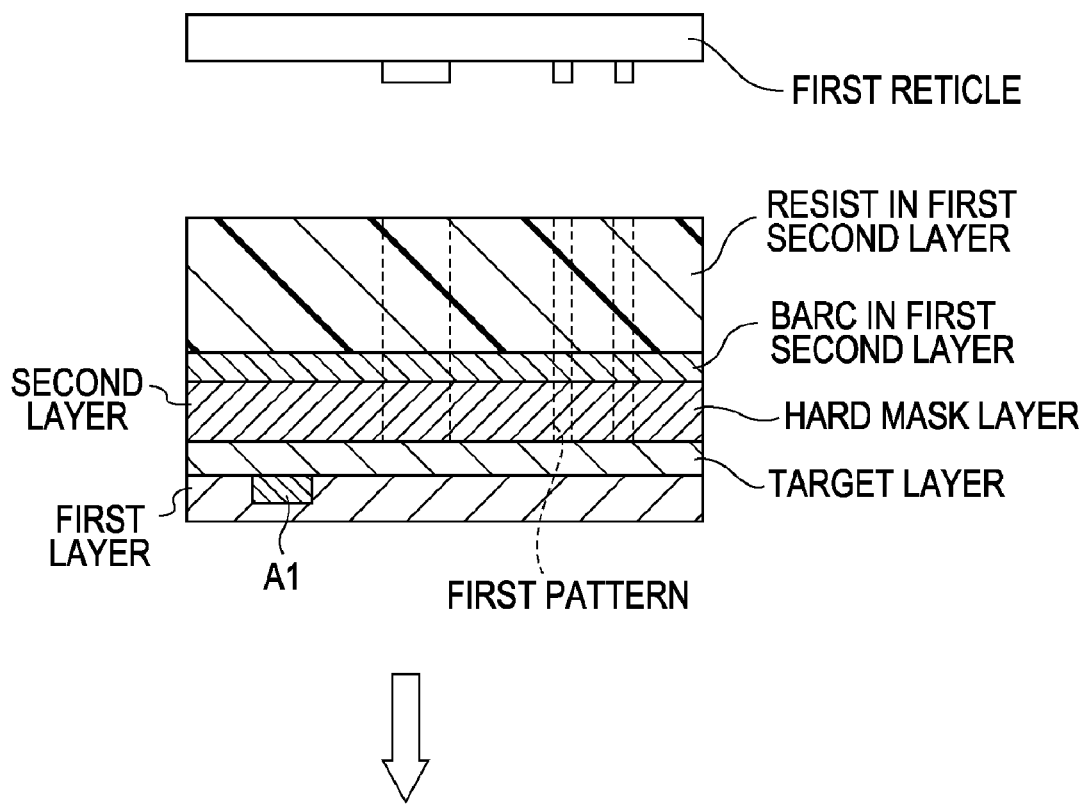
SECOND EXPOSURE
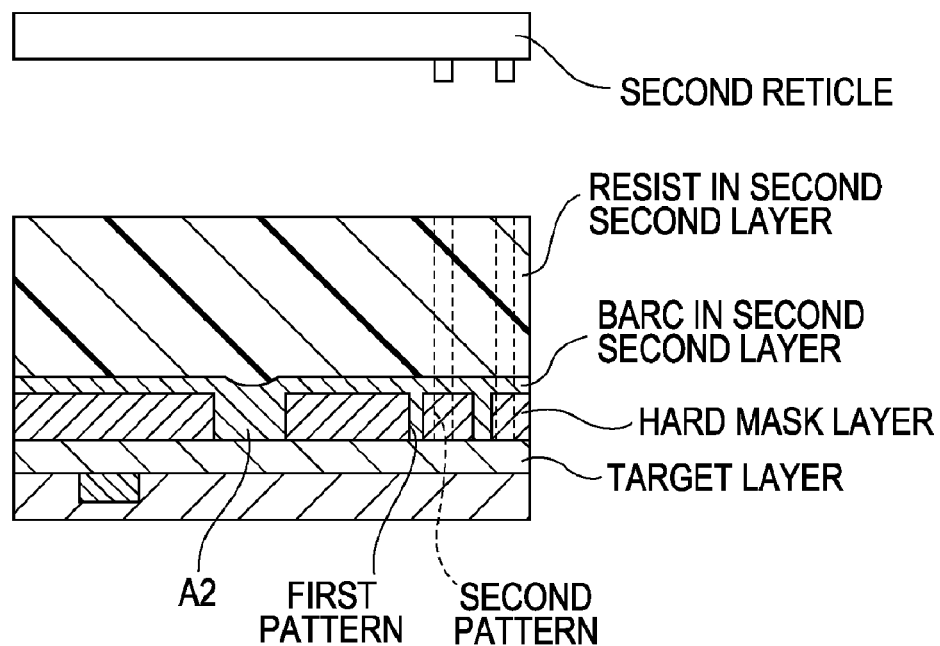

FIG. 15
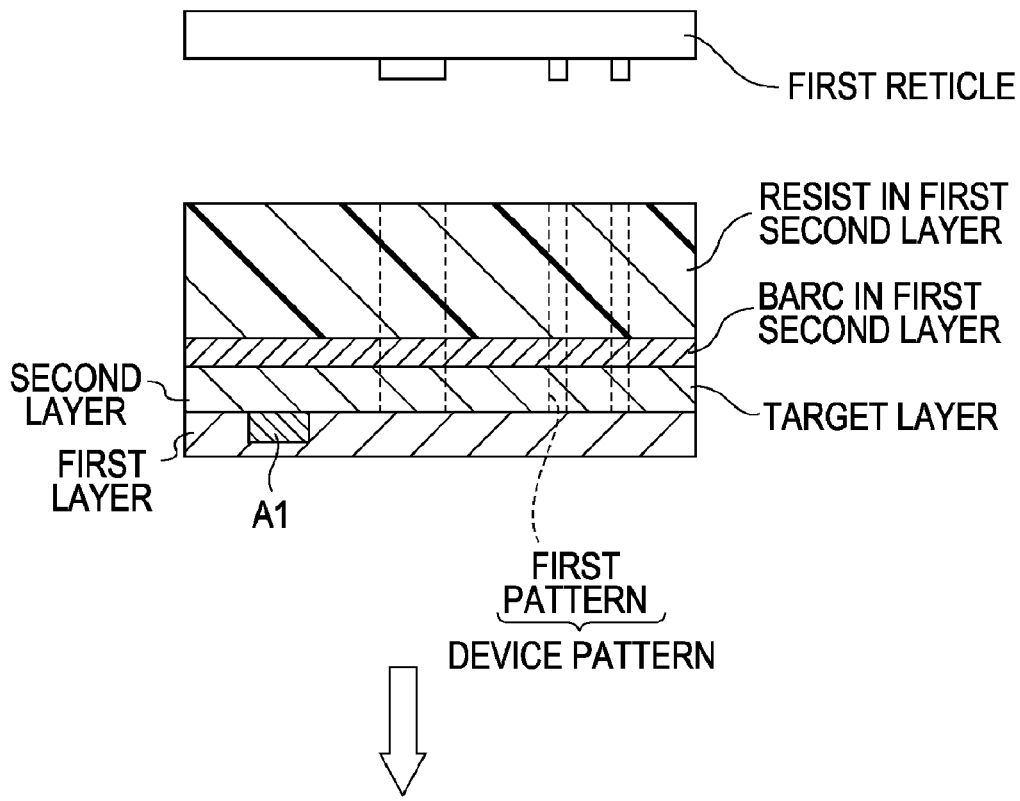
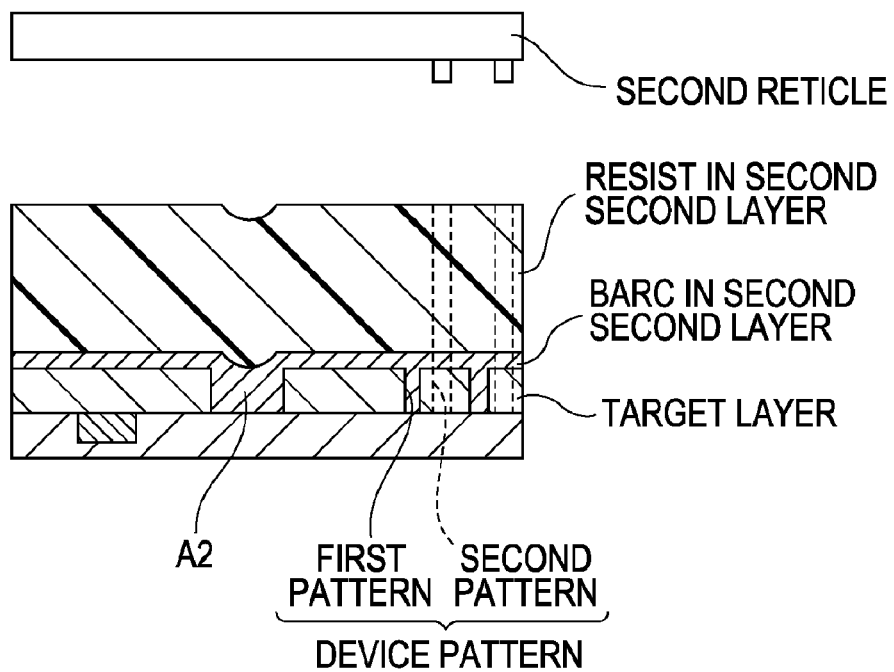

ALIGNMENT METHOD, EXPOSURE METHOD, PATTERN FORMING METHOD, AND EXPOSURE APPARATUS

BACKGROUND OF THE INVENTION

1. Field of the Invention

The present invention generally relates to alignment methods, exposure methods, pattern forming methods, and exposure apparatuses.

2. Description of the Related Art

With a recent demand for finer semiconductor device patterns and more efficient processes for manufacturing semiconductor devices, the demand for exposure apparatuses, which are used in manufacturing semiconductor devices, capable of realizing higher resolutions and higher efficiencies has been increasing.

In an exposure apparatus, a circuit pattern provided on an original, such as a reticle or a mask, is transferred to a substrate, such as a wafer or a glass plate, over which a photosensitive material (resist) is applied. In general, it is important in transferring a circuit pattern by exposure that relative positioning, i.e., alignment, between the original and the substrate is performed with high accuracy.

In a known alignment method, an alignment mark is transferred to a substrate by exposure simultaneously with a circuit pattern on the original. Among all exposure shots each including such an alignment mark, several shots are preselected and the positions of alignment marks in those preselected shots are measured with an alignment detection optical system. The results of the measurement are statistically processed and the alignment states of all the shots are calculated. In accordance with the results of the calculation, the substrate is positioned with respect to the original.

In recent years, various techniques for improving the resolution have been developed including immersion exposure and chemical shrinking. In particular, a technique called double patterning (double exposure) that can be realized without making a significant modification to the exposure system is considered to be a promising option for realizing finer circuit patterns.

FIG. 15 is a schematic diagram showing a process of double patterning. In double patterning, (a) first exposure, (b) development, and (c) first etching are performed with a first reticle having a circuit pattern thereon. Prior to the first exposure, a first alignment mark A1 provided in a first layer of a substrate is measured, and alignment of the substrate is performed for each shot. In this manner, the circuit pattern of the first reticle together with a second alignment mark A2 are transferred to a target layer of the substrate. Then, after reapplication of a resist, (d) second exposure, (e) development, and (f) second etching are performed with a second reticle having a pattern thereon different from that of the first reticle. Thus, the patterns on the respective reticles are transferred to the same layer. Prior to the second exposure, the second alignment mark A2 that has been transferred to the target layer is measured, and alignment of the substrate is performed for each shot. It is understood that performance of double patterning improves the resolution of the pattern (see "Manufacturing Challenges in Double Patterning Lithography", William Arnold et al., Manufacturing Control and Execution (MC)-233, International Symposium on Semiconductor Manufacturing (ISSM) 2006, 15th). Double patterning can be performed with either a negative or positive resist.

In double patterning, errors in alignment of a substrate between the first exposure and the second exposure often affect uniformity in the critical dimension (CD, i.e., the minimum line width). Therefore, it is necessary to align the substrate with high accuracy between the first exposure and the second exposure. In general, an allowable alignment error in double patterning is less than 10% of the CD. For example, in a case where a pattern with a half pitch of 45 nm is formed, the allowable alignment error is 2.6 nm.

However, in some cases where the second alignment mark A2 provided in the target layer is measured immediately before the second exposure, the center of the mark A2 may not be calculated accurately because of the asymmetry of the mark A2 itself. In addition, referring to FIG. 15, the mark A2 may not be measured accurately because of the asymmetry of a bottom anti-reflective coating (BARC) and the resist both included in a second second layer that is applied over the mark A2. If data obtained in such a measurement is used in substrate alignment performed in the second exposure, an alignment error may occur. Consequently, a pattern shift may occur.

SUMMARY OF THE INVENTION

The present invention provides an alignment method enabling highly accurate substrate alignment in double patterning and an exposure apparatus used in such a method.

According to a first aspect of the present invention, there is provided an alignment method in which alignment of a substrate including a first layer having a first alignment mark and a second layer overlying the first layer and having both a first pattern and a second alignment mark is performed in forming a second pattern in the second layer. The method includes storing first alignment measurement data to be used in alignment performed in forming both the first pattern and the second alignment mark in the second layer, the first alignment measurement data obtained by measuring the first alignment mark; obtaining second alignment measurement data by measuring the second alignment mark through a resist applied over the second layer; making a first comparison of a first difference between the first alignment measurement data and the second alignment measurement data with a first threshold; in response to the first difference being larger than the first threshold, making a second comparison of a second difference between the first alignment measurement data and third alignment measurement data with a second threshold, the third alignment measurement data obtained by measuring the first alignment mark through the resist applied over the second layer; and performing alignment of the substrate in accordance with the third alignment measurement data in response to the first difference being larger than the first threshold and the second difference being smaller than the second threshold, or in accordance with the second alignment measurement data in response to the first difference being smaller than or equal to the first threshold or the second difference being larger than or equal to the second threshold.

According to a second aspect of the present invention, there is provided an alignment method in which alignment of a substrate including a first layer having a first alignment mark and a second layer overlying the first layer and having both a first pattern and a second alignment mark is performed in forming a second pattern in the second layer. The method includes storing first alignment measurement data to be used in alignment performed in forming both the first pattern and the second alignment mark in the second layer, the first alignment measurement data obtained by measuring the first alignment mark; obtaining second alignment measurement data and third alignment measurement data by measuring the second alignment mark and the first alignment mark, respectively, through a resist applied over the second layer; making a first comparison of a first difference between the first alignment measurement data and the second alignment measurement data with a first threshold; in response to the first difference being larger than the first threshold, making a second comparison of a second difference between the first alignment measurement data and third alignment measurement data with a second threshold; and performing alignment of the substrate in accordance with the third alignment measurement data in response to the first difference being larger than the first threshold and the second difference being smaller than the second threshold, or in accordance with the second alignment measurement data in response to the first difference being smaller than or equal to the first threshold or the second difference being larger than or equal to the second threshold.

According to a third aspect of the present invention, there is provided an exposure apparatus configured to transfer an image of a pattern on an original to a substrate by exposure. The apparatus includes a measurement section configured to measure an alignment mark provided in the substrate, a storage section configured to store alignment measurement data obtained in measurement of the alignment mark performed by the measurement section, and a control section configured to control alignment of the substrate in accordance with the alignment measurement data stored in the storage section. The storage section stores first alignment measurement data obtained in measurement of a first alignment mark performed by the measurement section, the first alignment mark provided in a first layer of the substrate; second alignment measurement data obtained in measurement of a second alignment mark performed by the measurement section, the second alignment mark together with a first pattern formed in a second layer overlying the first layer after the substrate is aligned under the control of the control section in accordance with the first alignment measurement data, the measurement of the second alignment mark performed through a resist applied over the second layer; and third alignment measurement data obtained in measurement of the first alignment mark performed by the measurement section through the resist applied over the second layer. In a case where an image of a second pattern to be formed in the second layer is transferred to the resist by exposure, the control section controls alignment of the substrate in accordance with the third alignment measurement data in response to a difference between the first alignment measurement data and the second alignment measurement data being larger than a first threshold and a difference between the first alignment measurement data and the third alignment measurement data being smaller than a second threshold, or in accordance with the second alignment measurement data in response to the difference between the first alignment measurement data and the second alignment measurement data being smaller than or equal to the first threshold or the difference between the first alignment measurement data and the third alignment measurement data being larger than or equal to the second threshold.

According to a fourth aspect of the present invention, there is provided an alignment method in which alignment of a substrate including a first layer having a first alignment mark and a second layer overlying the first layer and having both a first pattern and a second alignment mark is performed in forming a second pattern in the second layer. The method includes storing first alignment measurement data to be used in alignment performed in forming both the first pattern and the second alignment mark in the second layer, the first alignment measurement data obtained by measuring the first alignment mark; obtaining second alignment measurement data by measuring the second alignment mark through a resist applied over the second layer; obtaining third alignment measurement data by measuring the first alignment mark through the resist applied over the second layer; and performing alignment of the substrate in accordance with a difference between the first alignment measurement data and the second alignment measurement data, or in accordance with both the difference between the first alignment measurement data and the second alignment measurement data and a difference between the first alignment measurement data and the third alignment measurement data.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2 is a schematic diagram of an exposure apparatus as an aspect of the present invention.

FIG. 6 is a graph showing a result of measurement of the alignment mark.

FIG. 7 is a schematic diagram of a signal processing section.

FIG. 9 is a diagram illustrating the process of double patterning as an aspect of the present invention.

FIG. 10 is a table summarizing results of AGA.

FIG. 14 is a diagram illustrating the process of double patterning according to a fifth embodiment of the present invention.

FIG. 15 is a diagram illustrating a known process of double patterning.

DESCRIPTION OF THE EMBODIMENTS

Figure 1:
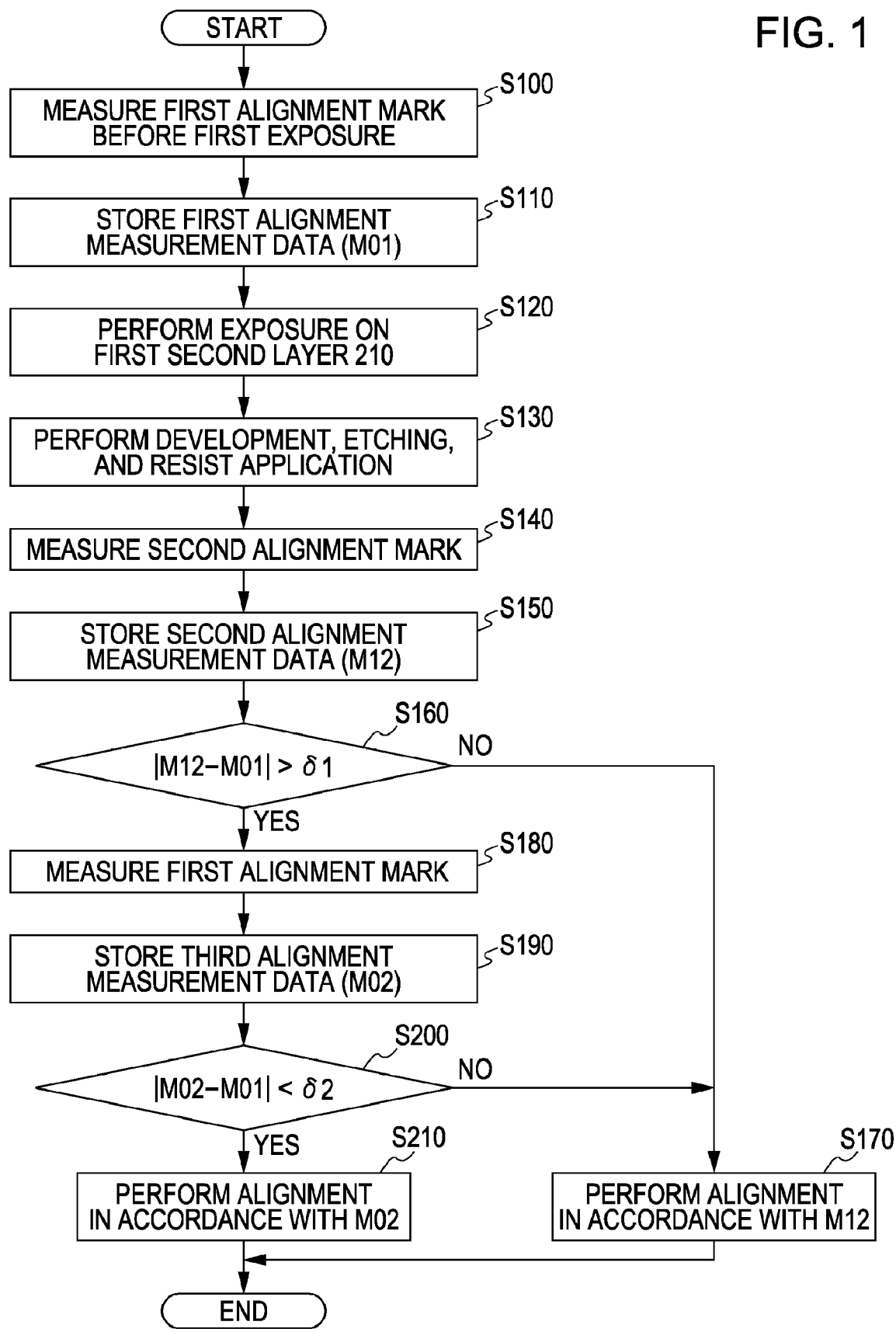
FIG. 1 is a flowchart showing the process of double patterning according to a first embodiment of the present invention.

Embodiments of the present invention will now be described in detail in accordance with the accompanying drawings.

First Embodiment

A first embodiment of the present invention will be described. FIG. 2 is a schematic diagram of an exposure apparatus 1. In the exposure apparatus 1, a circuit pattern provided on an original (a mask or reticle) is transferred to a substrate (a wafer) by step-and-scan or step-and-repeat exposure, for example. "Step-and-scan exposure" is an exposure method for transferring a reticle pattern to the wafer by consecutively scanning the wafer that is moved relative to the reticle while, after each exposure shot, moving the wafer in a stepping manner to a position corresponding to the subsequent exposure shot. "Step-and-repeat exposure" is an exposure method for transferring a reticle pattern to the wafer by statically holding the wafer relative to the reticle (i.e., block exposure) while, after each block-exposure shot, moving the wafer in a stepping manner to a position corresponding to the subsequent exposure shot.

Referring to FIG. 2, the exposure apparatus 1 includes an illumination optical system 100, a projection optical system 120, a wafer chuck 145, a wafer stage 140, an alignment optical system 150, a signal processing section 160, and a control section 170. The illumination optical system 100 illuminates a reticle 110 with light emitted from a light source 10. The projection optical system 120 projects a pattern (such as a circuit pattern) provided on the reticle 110 onto a wafer 130 in a reduced size. The wafer chuck 145 holds the wafer 130. The wafer 130 has an underlying pattern and an alignment mark 180 both provided therein in a front-end process. The wafer stage 140 sets the wafer 130 at a predetermined position. The alignment optical system 150 measures the alignment mark 180 provided in the wafer 130.

The control section 170 includes a central processing unit (CPU) and a memory (a storage medium), and controls the operation of the exposure apparatus 1. The control section 170 is electrically connected to the light source 10, the illumination optical system 100, a reticle stage, the wafer stage 140, and the signal processing section 160, and individually controls the same. The control section 170 controls the wafer stage 140 in accordance with alignment information sent from the signal processing section 160, whereby alignment (positioning) of the wafer 130 is performed.

Figure 3:
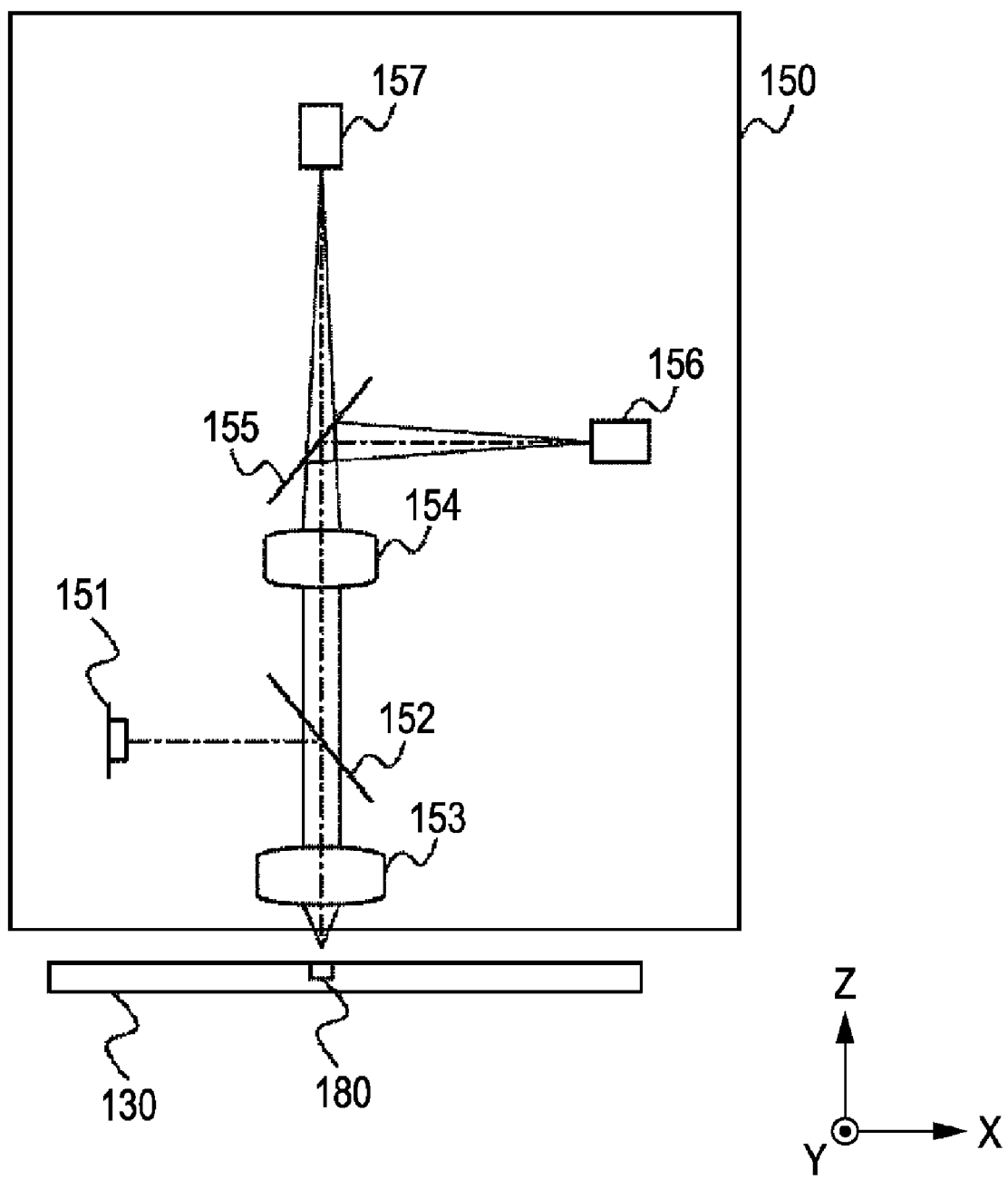
FIG. 3 is a schematic diagram of an alignment optical system.

Next, measurement of the alignment mark 180 will be described. FIG. 3 is a schematic diagram of the alignment optical system 150 serving as a measurement section configured to measure the alignment mark 180. Referring to FIG. 3, illuminating light from a light source 151 is reflected by a beam splitter 152, is transmitted through an objective lens 153, and is applied to the alignment mark 180 in the wafer 130. The light (reflected and diffracted light) from the alignment mark 180 is transmitted through the objective lens 153, the beam splitter 152, and a lens 154, is split by a beam splitter 155, and is received by image pickup sensors 156 and 157, such as CCDs.

The light from the alignment mark 180 is magnified by the lenses 153 and 154 at about a 100 magnification, and is received as an image by the image pickup sensors 156 and 157. The image pickup sensors 156 and 157 are used for X-direction measurement and Y-direction measurement, respectively, of the alignment mark 180. Each of the image pickup sensors 156 and 157 may be replaced by a line sensor. If a line sensor is used, measurement can be performed with a cylindrical lens having a refractive power only in a direction perpendicular to the measurement direction (the direction of the line of the sensor) by collecting light in the direction perpendicular to the measurement direction. The result of the measurement with the line sensor can be averaged by optical integration. The X- and Y-direction measurements are performed on the basis of the same principle. Hence, the X-direction measurement will be described herein.

Figure 4A:
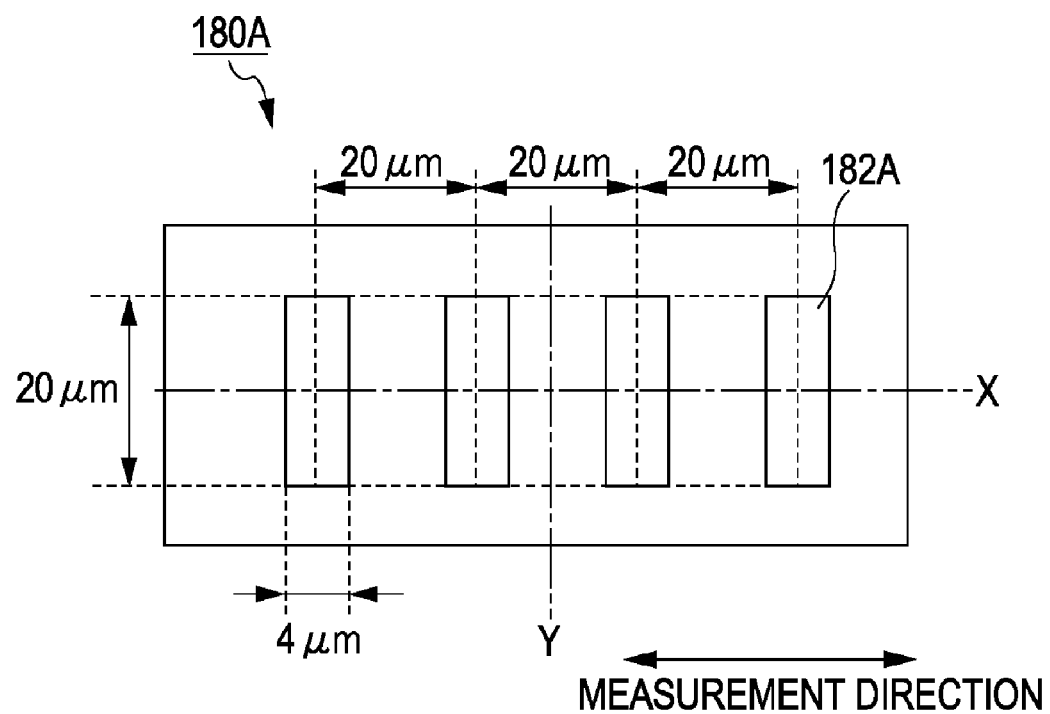
FIGS. 4A and 4B are a schematic plan view and a schematic cross-sectional view of an alignment mark.
Figure 4B:
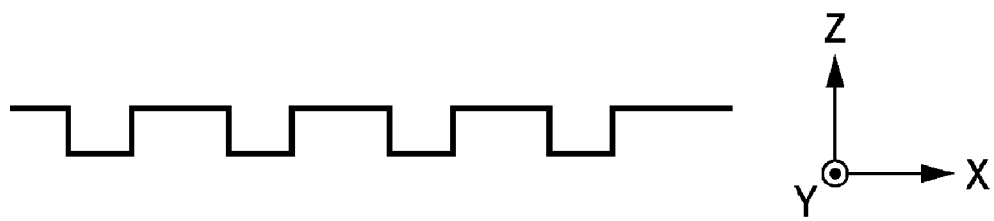
Figure 5A:
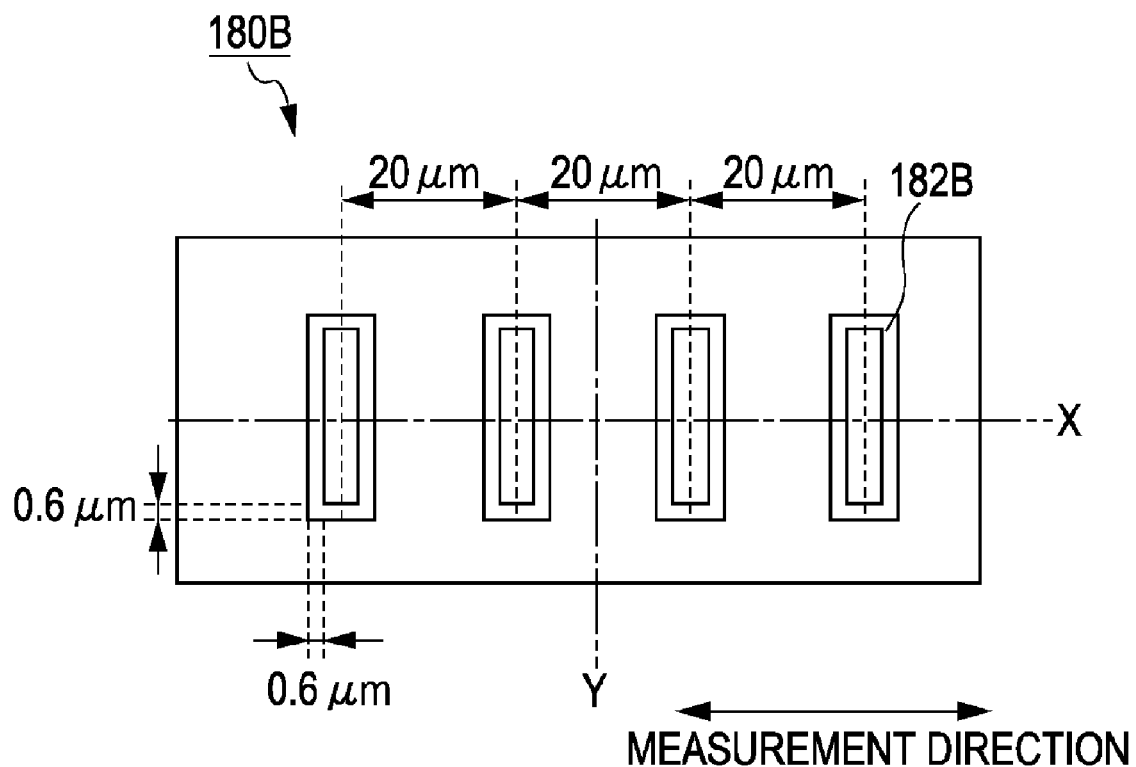
FIGS. 5A and 5B are a schematic plan view and a schematic cross-sectional view of another alignment mark.
Figure 5B:
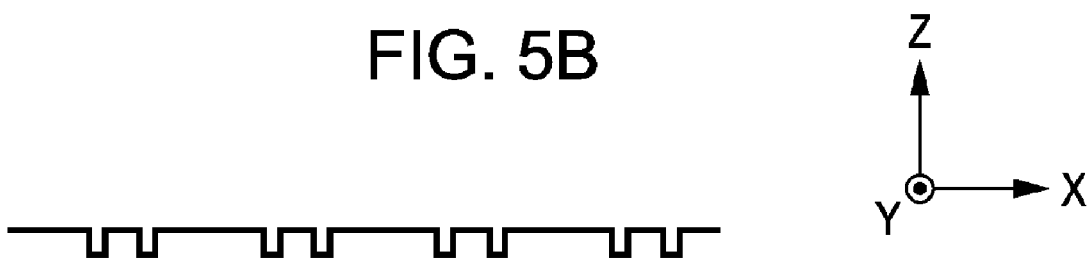

The alignment mark 180 is provided on a scribe line in the wafer 130. FIGS. 4A to 5B show the shapes of exemplary alignment marks 180A and 180B that can be used in this measurement. The alignment marks 180A and 180B are generally denoted as the alignment mark 180. FIGS. 4A and 4B are a plan view and a cross-sectional view, respectively, of the alignment mark 180A. FIGS. 5A and 5B are a plan view and a cross-sectional view, respectively, of the alignment mark 180B. In FIGS. 4A to 5B, the alignment marks 180A and 180B each include four mark elements 182A or 182B arranged at a constant pitch. Practically, the alignment marks 180A and 180B are each covered with a resist. However, the resist is omitted in each of FIGS. 4A to 5B.

Referring to FIG. 4A, the four mark elements 182A in the alignment mark 180A each have a rectangular shape with an X-direction (measurement-direction) length of 4 µm and a Y-direction length of 20 µm, and are arranged in the X direction at a 20 µm pitch. Referring to FIG. 4B, each of the mark elements 182A has a concave profile. Referring to FIGS. 5A and 5B, the four mark elements 182B of the alignment mark 180B each have a shape obtained by replacing the outline of the mark element 182A shown in FIGS. 4A and 4B with a groove of 0.6 µm width.

FIG. 6 is a graph showing an exemplary result of picking up the image of the alignment mark 180A or 180B with the image pickup sensor 156. Referring to FIG. 6, components having frequencies higher than the diffraction limit are usually cut off at positions corresponding to the edges of the alignment mark. This is because part of light scattered at the edges forms an incident angle larger than the maximum incident angle determined by the numerical aperture of the alignment optical system 150 and therefore cannot be transmitted through the alignment optical system 150. Such a phenomenon applies to both the alignment marks 180A and 180B. Alignment mark measurement can be performed with either a bright-field or dark-field image.

The data (signal) of the alignment mark 180 obtained as described above is processed by the signal processing section 160. FIG. 7 outlines the signal processing section 160 and the connection between the alignment optical system 150 and the control section 170. The signal processing section 160 includes an analog/digital (A/D) converter 161, a storage unit 162, an arithmetic logical unit 163, and a communication unit 164. The arithmetic logical unit 163 is connected to the A/D converter 161, the storage unit 162, and the communication unit 164. Analog signals from the image pickup sensors 156 and 157 are converted by the A/D converter 161 into digital signals in response to a command from the arithmetic logical unit 163. The digital signals are stored in the storage unit 162 and, at the time of arithmetic processing, are read by the arithmetic logical unit 163. The arithmetic logical unit 163 reads the digital signals stored in the storage unit 162 and performs various data processings thereto, thereby calculating the positions (positions of the center, the edges, and so forth) of the alignment mark. Such data can be processed in various manners. For example, edge positions are calculated by extracting portions of measurement data corresponding to the edge positions, or the center position and so forth of the alignment mark are calculated by a pattern matching method using a template or a symmetry matching method (see Japanese Patent Laid-Open No. 6-151274). Specifically, in the case of the measurement data shown in FIG. 6, portions corresponding to the four respective mark elements are extracted and the centers of the extracted portions are calculated, whereby the center positions (X1, X2, X3, and X4) of the respective mark elements can be obtained.

Data on the alignment mark obtained by the image pickup sensors may be either two-dimensional or one-dimensional data. A two-dimensional image of the alignment mark can be converted into a one-dimensional image in the following manner: A histogram is prepared in which the vertical scale represents pixels of the image arrayed in the horizontal direction, the image of the alignment mark is subjected to voting, and the results of the voting are averaged by taking major components.

After calculating the positions of the alignment mark, the arithmetic logical unit 163 further calculates data used for alignment such as global alignment described separately below. Such data is referred to as alignment measurement data. The result of global alignment (advanced global alignment: AGA) are available as alignment measurement data. The available data include various pieces of data on the entirety of a wafer obtained by measuring respective alignment marks in sample shots, such as shifts Sx and Sy, magnifications βx and βy, and rotations θx and θy. More specifically, wafer orthogonality obtained as the difference between θx and θy can be used instead of wafer rotations θx and θy. This is because wafer orthogonality is a parameter enabling more quantitative measurement of changes occurring in AGA because of the wafer process.

Alignment information calculated by the arithmetic logical unit 163 as described above is stored in the storage unit 162 together with a wafer identification number (ID) given thereto. The alignment information stored in the storage unit 162 is output through the communication unit 164 to the control section 170 and is used for controlling the wafer stage.

The storage unit 162, which is included in the signal processing section 160, may be connected to the arithmetic logical unit 163 from outside the signal processing section 160 or the exposure apparatus 1. For example, the storage unit 162 may be provided in a host computer connected to the exposure apparatus 1 over a network.

Next, a method of performing alignment of the wafer 130 will be described. Alignment of the wafer 130 is controlled by the control section 170. The control section 170 controls the wafer stage 140 in accordance with data (alignment measurement data) processed by the signal processing section 160. In the first embodiment, an alignment method called advanced global alignment (AGA) will be described. Needless to say, the alignment method is not limited to AGA. In AGA, some of all shots of a wafer are taken as sample shots, and the positions of respective alignment marks in the sample shots are detected. The measured positions of the alignment marks in the sample shots are statistically processed with reference to design values (positions according to the design) of the alignment mark. On the basis of this statistical processing, alignment parameters are determined. For example, six parameters on the entirety of the wafer can be named: x- and y-direction shifts Sx and Sy, x- and y-direction magnifications βx and βy, and x- and y-axis rotations (amounts of rotations) θx and θy. Alignment is performed during the exposure process with reference to these parameters for each of all shots of the wafer 130. In calculating the parameters, inappropriate data (outliers) not suitable for use in alignment can be removed, for example, according to need, so as to improve alignment accuracy.

Figure 8:
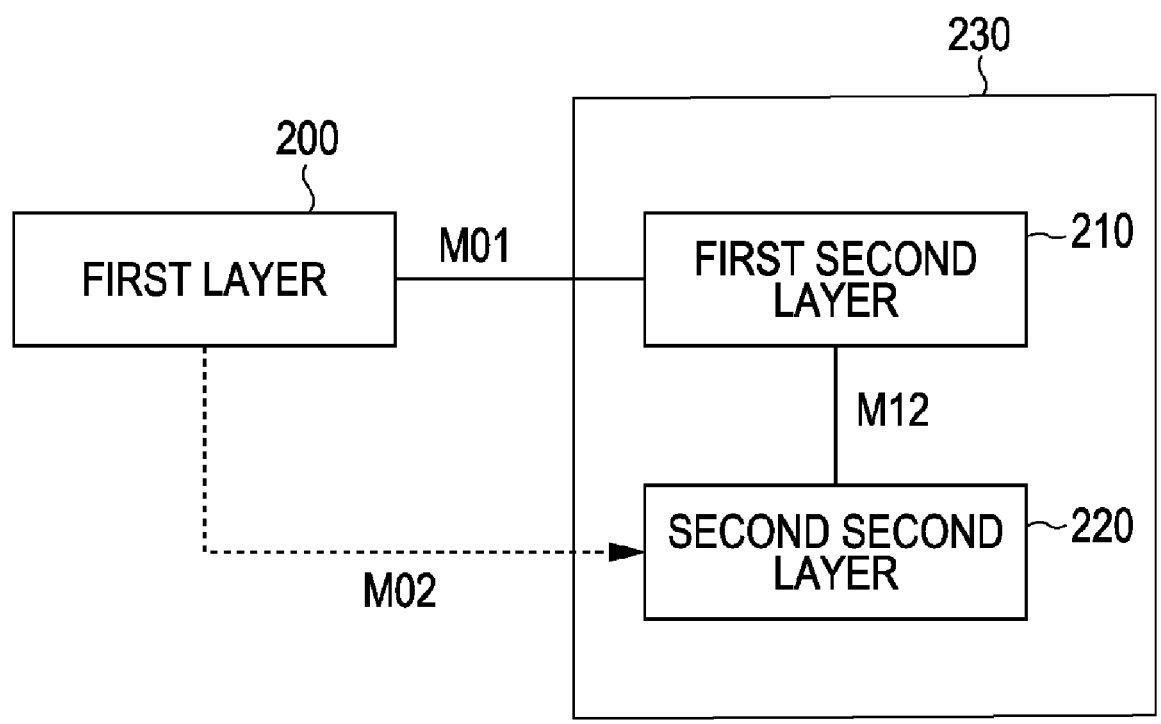
FIG. 8 is an alignment tree.

Next, alignment performed in double patterning will be described with reference to FIGS. 1, 8, and 9. FIG. 1 is a flowchart showing the process of double patterning according to the first embodiment. FIG. 8 is an alignment tree. FIG. 9 is a diagram illustrating the process of double patterning.

Referring to FIG. 9, the wafer 130 includes a layer (hereinafter referred to as a first layer) 200 having a first alignment mark A1, and a target layer (hereinafter referred to as a second layer) 230 overlying the first layer 200. A circuit pattern is to be provided in the second layer 230. Further, a BARC and a resist are provided over the second layer 230. The BARC and the resist are generally denoted as a first second layer 210.

A wafer 130 having such a layered structure is conveyed into the exposure apparatus. Referring to FIG. 1, in step S100, the first alignment mark A1 provided in the first layer 200 is measured through the first second layer 210. In step S110, alignment data obtained in this measurement is stored as first alignment measurement data (M01) in correspondence with an ID given to the wafer 130. The ID of the wafer 130 may be obtained with any timing before or after the wafer 130 is conveyed into the exposure apparatus. In step S120, after the wafer 130 is aligned in accordance with the measurement data (M01), exposure of the first second layer 210 (first exposure) is performed with a first reticle.

In step S130, after development of the first second layer 210 and etching of the second layer 230, a first pattern and a second alignment mark A2 are formed in the second layer 230. Further, the resist and the BARC are applied again over the second layer 230, whereby a second second layer 220 is provided. The development, etching, and resist application are performed after the wafer 130 is temporarily taken out of the exposure apparatus.

In step S140, the wafer 130 is conveyed into the exposure apparatus again, and the second alignment mark A2 provided in the second layer 230 is measured through the second second layer 220. In step S150, alignment data obtained in this measurement is stored as second alignment measurement data (M12) in the storage unit 162 in correspondence with the ID of the wafer 130. The ID of the wafer 130 used in this step may be obtained with any timing.

In step S160, the arithmetic logical unit 163 refers to the ID of the wafer 130 that has been conveyed into the exposure apparatus and reads the corresponding data M01 and M12 of the wafer 130 having the same ID from the storage unit 162. Further, the arithmetic logical unit 163 calculates the difference between the data M01 and M12 and compares the difference with a first threshold δ1. Here, the difference between the data M01 and M12 are desired to be small. However, since the wafer 130 that has been subjected to the first exposure is further subjected to various processes including development, etching, and resist application, such processes may cause errors in alignment measurement data, leading to a difference between the data M01 and M12. Errors due to processes are also called wafer-induced shifts (WIS). For example, referring to FIG. 9, if the BARC included in the second second layer 220 has a depression at a position corresponding to the second alignment mark A2, accurate measurement data may not be obtained.

If alignment of the wafer 130 is performed in accordance with the data M12 while there is a significant difference between the data M01 and M12, the pattern may be formed with a large shift. From this viewpoint, it is necessary to check whether alignment using the data M12 is appropriate or not, considering the difference between the data M01 and M12.

More particularly, it is checked whether or not the absolute value of the calculated difference between the data M01 and M12 is larger than the first threshold δ1. This is expressed as follows:

$$|M12-M01|>\delta 1 \qquad (1)$$

If Expression (1) is not satisfied, the process proceeds to step S170 in which alignment is performed in accordance with the second alignment measurement data (M12). When it is determined that the absolute value of the difference between the data M01 and M12 is larger than the first threshold δ1, the process proceeds to step S180.

An absolute value of the difference between the data M01 and M12 larger than the first threshold δ1 means that alignment with the data M12 is not appropriate. In such a case, the first alignment mark A1 is measured as a substitute for the second alignment mark A2. That is, in step S180, the first alignment mark A1 is measured through the second second layer 220. Then, in step S190, alignment data obtained in this measurement is stored in the storage unit 162 as third alignment measurement data (M02) in correspondence with the ID of the wafer 130.

In step S200, the arithmetic logical unit 163 refers to the ID of the wafer 130 and reads the corresponding data M01 and M02 of the wafer 130 having the same ID from the storage unit 162. Further, the arithmetic logical unit 163 calculates the difference between the data M01 and M02 and compares the difference with a second threshold δ2. In the first embodiment, it is checked whether or not the absolute value of the difference between the data M01 and M02 is smaller than the second threshold δ2. This is expressed as follows:

$$|M02-M01|<\delta 2 \qquad (2)$$

If Expression (2) is satisfied, the process proceeds to step S210 in which alignment is performed in accordance with the third alignment measurement data (M02). If the absolute value of the difference between the data M01 and M02 is not smaller than the second threshold δ2, the process proceeds to step S170 in which alignment is performed in accordance with the second alignment measurement data (M12). An absolute value of the difference between the data M01 and M02 smaller than the second threshold δ2 means that higher alignment accuracy can be realized by alignment with the data M02 than with the data M12. In contrast, an absolute value of the difference between the data M01 and M02 larger than or equal to the second threshold δ2 means that it is appropriate to perform alignment with data on the alignment mark provided directly in the target layer, i.e., the data M12.

After alignment of the wafer 130 is performed in accordance with the data M02 or M12, the second second layer 220 (the resist) is exposed to light through the second reticle having a pattern thereon, whereby a latent image for forming a second pattern is obtained. Subsequently, the latent image is developed and etching of the second layer 230 is performed. Thus, the first and second patterns are provided in the second layer 230.

Next, a specific example of AGA will be described. In a case of an 8 inch wafer and exposure of 46 shots, an error of 0.01 ppm in wafer magnification measurement based on AGA theoretically results in an alignment error variance of 3σ=1.2 nm (σ represents standard deviation). To suppress the variance in total alignment error (variance in total overlay error) to 3σ=2.6 nm or smaller, the error in wafer magnification needs to be suppressed to 0.01 ppm or smaller. FIG. 10 shows exemplary results of AGA. In this case, the first and second thresholds δ1 and δ2 are defined as 0.01 ppm and 0.005 ppm, respectively. Focusing on the x-direction wafer magnification βx, the following relationships are established: |M12−M01|=0.018 ppm>δ1 (=0.01 ppm) while |M02−M01|=0.003 ppm<δ2 (=0.005 ppm). This means that alignment can be performed in accordance with the third alignment measurement data (M02).

In the first embodiment, the third alignment measurement data (M02) is obtained after the first comparison in step S160. Alternatively, the third alignment measurement data (M02) may be obtained before step S160. However, the third alignment measurement data (M02) is alignment measurement data based on indirect alignment and is originally not necessary to be measured. Therefore, if the data M02 is obtained before step S160, both data M12 and M02 need to be obtained for every wafer. In such a case, if Expression (1) in step S160 is not satisfied, time may be wasted obtaining the data M02. In contrast, if the data M02 is obtained after step S160, no time is wasted and therefore processing time can be reduced.

According to the first embodiment, highly accurate substrate alignment is realized in double patterning. Moreover, process-induced errors can be reduced, whereby more highly accurate substrate alignment is realized. Consequently, pattern shifts occurring in forming patterns can be reduced.

Second Embodiment

Next, a second embodiment of the present invention will be described. Description common to the first embodiment will be omitted. In the first embodiment, parameters indicating shift, magnification, and rotation in the entirety of a wafer observed in AGA are taken as alignment measurement data. The second embodiment differs from the first embodiment in that residuals or residual variances resulting from AGA are taken as alignment measurement data.

Figures 11A, 11B:
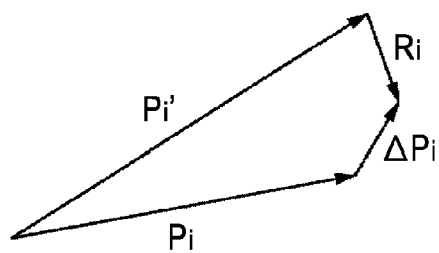
FIGS. 11A and 11B are diagrams illustrating residuals in AGA.

Referring to FIGS. 11A and 11B, the residual variance will be described. As shown in FIG. 11A, the design position of an alignment mark in a sample shot i is denoted as Pi (Xi,Yi), and the measured position of the alignment mark is denoted as ΔPi (ΔXi,ΔYi). When these values are obtained for all sample shots and are subjected to statistical processing based on AGA, the position of the alignment mark in the sample shot i is defined as Pi' (Xi',Yi'). In this case, the residual Ri in the sample shot is expressed as follows:

$$Ri=(Pi+\Delta Pi)-Pi' \qquad (3)$$

FIG. 11B summarizes exemplary x-direction components of the residual Ri calculated from Expression (3) for eight sample shots. Here, a residual obtained by measuring the second alignment mark A2 provided in the first second layer is denoted as Ri12, a residual obtained by measuring the first alignment mark A1 provided in the first layer through the first second layer is denoted as Ri01, and a residual obtained by measuring the first alignment mark A1 through the second second layer is denoted as Ri02. The residuals Ri12, Ri01, and Ri02 are calculated for each of the eight shots, and the residual variance 3σ is calculated for each group of the residuals Ri12, Ri01, and Ri02. As summarized in FIG. 11B, the residual variance (M12) for Ri12 is 2.2 nm, the residual variance (M01) for Ri01 is 1.3 nm, and the residual variance (M02) for Ri02 is 1.6 nm. With these residual variances as alignment measurement data, the first and second thresholds δ1 and δ2 are defined as 0.6 nm and 0.4 nm, respectively. When the first and second thresholds δ1 and δ2 are compared with the differences between M12 and M01 and between M02 and M01, respectively, the following relationships are established: |M12−M01|=0.9 nm>δ1 (=0.6 nm), and |M02−M01|=0.3 nm<δ2 (=0.4 nm). This indicates that, according to the flowchart shown in FIG. 1, alignment can be performed in accordance with the third alignment measurement data (M02).

Alternatively, the residuals themselves calculated for each sample shot may be used as alignment measurement data. For example, according to the flowchart shown in FIG. 1, the difference between the residuals Ri12 (M12) and Ri01 (M01) or between the residuals Ri02 (M02) and Ri01 (M01) is calculated for a certain sample shot, and then alignment is performed in accordance with the result of the calculation.

According to the second embodiment, highly accurate wafer alignment is realized even if there are significant random process-induced errors varying with different shots of the wafer. Therefore, pattern shifts occurring in forming patterns can be reduced.

Third Embodiment

Next, a third embodiment of the present invention will be described. Description common to the first and second embodiments will be omitted. In the second embodiment, residuals or residual variances are taken as alignment measurement data. The third embodiment differs from the second embodiment in that values obtained by quantifying the asymmetry of the signal waveform of the measured alignment mark are taken as alignment measurement data.

Figure 12:
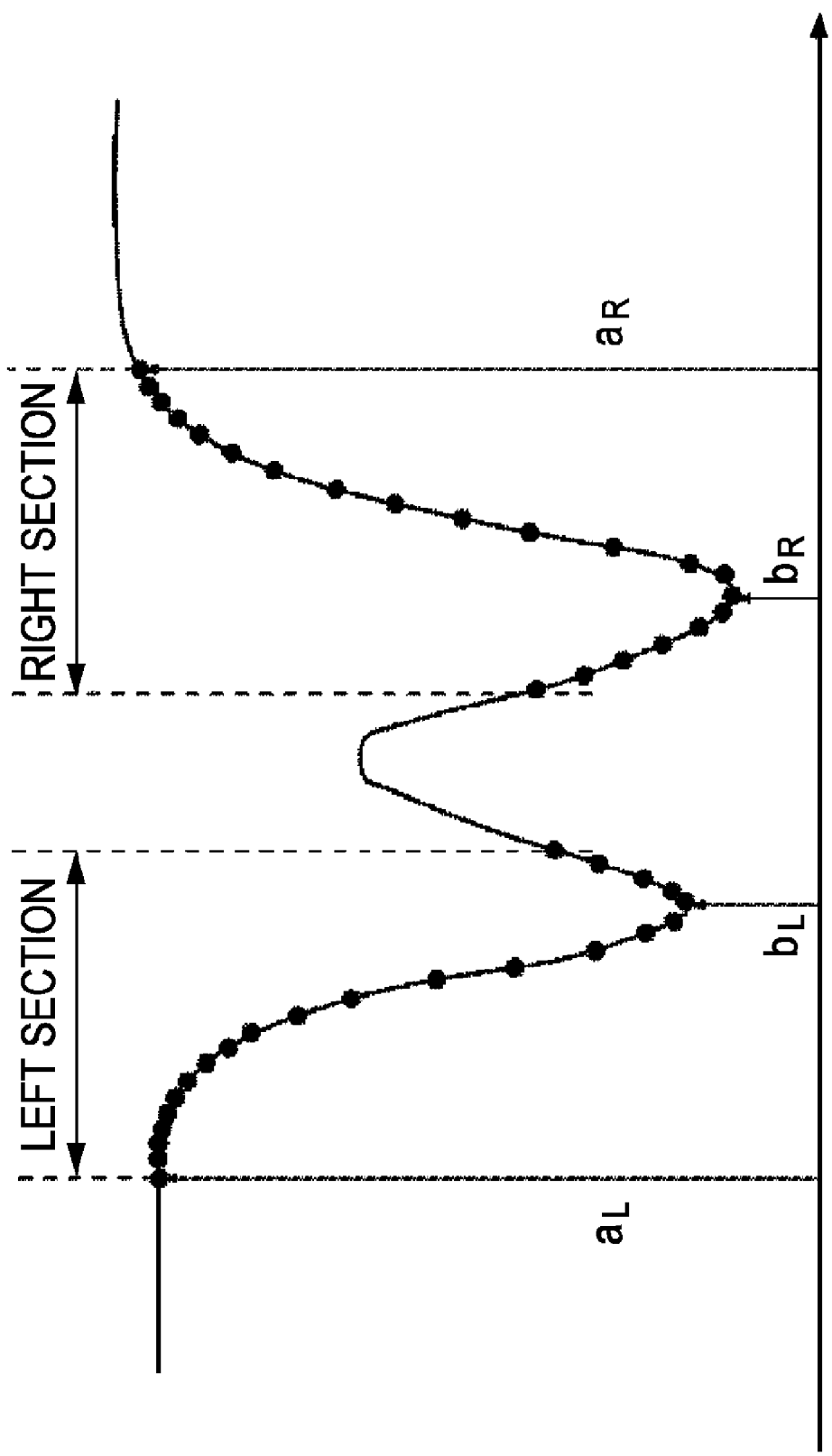
FIG. 12 is a diagram illustrating the waveform of the alignment mark and a waveform evaluation value.
Figure 13:
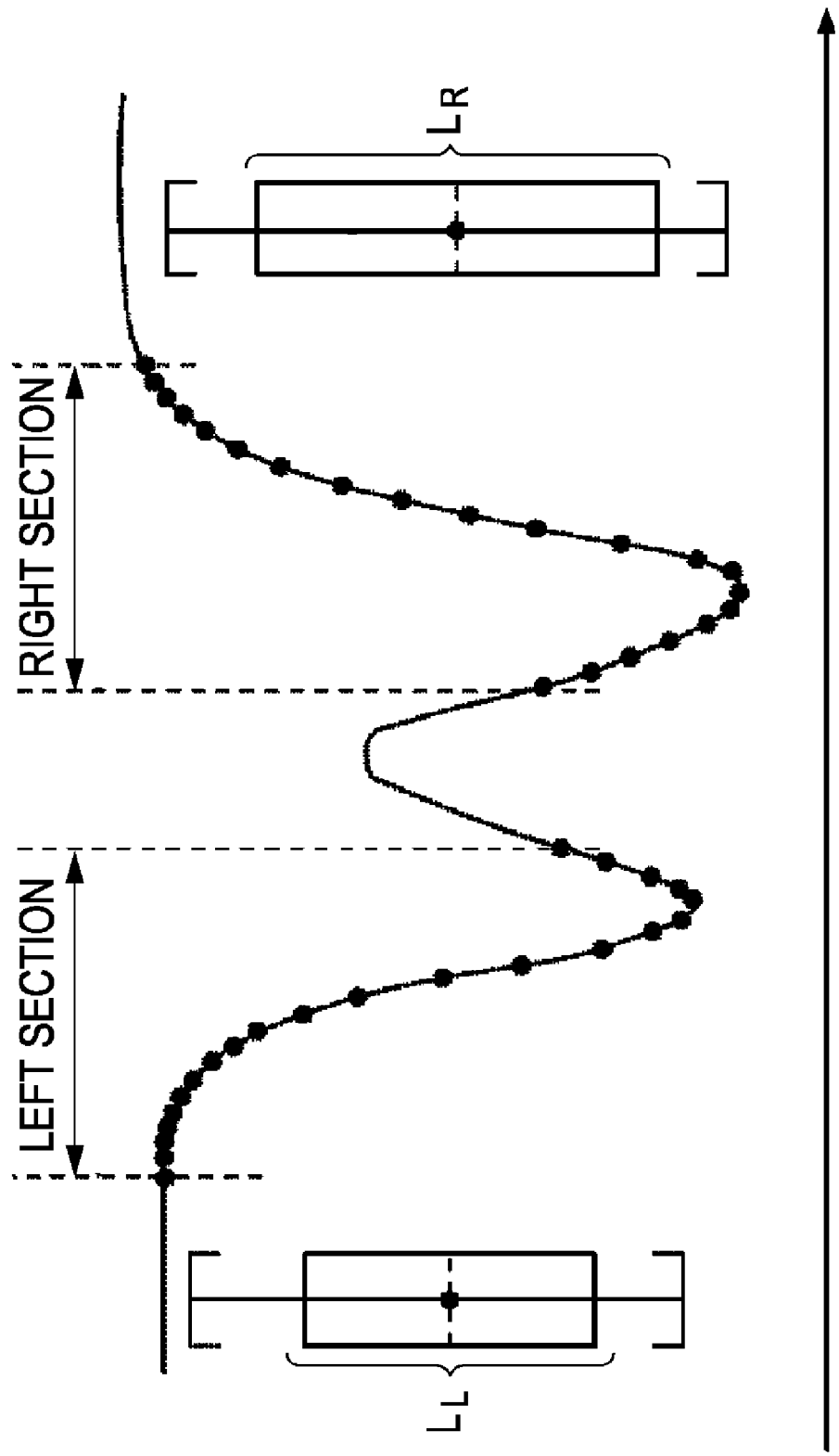
FIG. 13 is another diagram illustrating the waveform of the alignment mark and the waveform evaluation value.

Referring to FIGS. 12 and 13, a waveform evaluation value that quantifies the asymmetry of the signal waveform of the alignment mark will be described. In FIG. 12, the maximum and minimum values in the left section of the signal waveform of an alignment mark are denoted as $a_L$ and $b_L$, respectively, and the maximum and minimum values in the right section are denoted as $a_R$ and $b_R$, respectively. When the difference in contrast between the left and right sections is denoted as the waveform evaluation value Ev, the waveform evaluation value Ev is defined as follows:

$$Ev = \frac{a_L - b_L}{a_L + b_L} - \frac{a_R - b_R}{a_R + b_R} \qquad (4)$$

With Expression (4), the asymmetry of the signal waveform of the alignment mark can be evaluated.

Alternatively, referring to FIG. 13, the left and right sections of the signal waveform of the alignment mark may be represented by boxplots, which are used in some statistical techniques. When the lengths of boxes representing the right and left sections are denoted as $L_R$ and $L_L$, respectively, the waveform evaluation value Ev is expressed as follows:

$$Ev = \frac{L_L - L_R}{L_L + L_R} \qquad (5)$$

With Expression (5), the asymmetry of the signal waveform of the alignment mark can also be evaluated. For boxplots, consult "The New s Language: A programming Environment for Data Analysis and Graphics" (R. A. Becker, J. M. Chambers, and A. R. Wilks, Kyoritsu Shuppan).

In the third embodiment, the waveform evaluation value described above is taken as alignment measurement data. Here, a waveform evaluation value Ev obtained by measuring the second alignment mark A2 provided in the first second layer is denoted as Ev12, a waveform evaluation value Ev obtained by measuring the first alignment mark A1 in the first layer through the first second layer is denoted as Ev01, and a waveform evaluation value Ev obtained by measuring the first alignment mark A1 through the second second layer is denoted as Ev02. For example, according to the flowchart shown in FIG. 1, the difference between Ev12 (M12) and Ev01 (M01) or between Ev02 (M02) and Ev01 (M01) may be calculated, and then alignment may be performed in accordance with the result of the calculation.

As described above, x- and y-direction values can be obtained per sample shot i as measurements of the alignment mark. In a case where the alignment mark waveform evaluation value Ev is obtained for each of x- and y-directions, the x- and y-direction values may be averaged and the average may be taken as the waveform evaluation value (Evi) of a sample shot i. Moreover, in a case where Evi is calculated for each of the sample shots, the variance (3σ) in Evi values may be taken as alignment measurement data.

According to the third embodiment, process-induced errors can be reduced by using data on the signal waveform itself obtained in measurement of the alignment mark, and thus highly accurate substrate alignment is realized. Therefore, pattern shifts occurring in forming patterns can be reduced.

Fourth Embodiment

Next, a fourth embodiment of the present invention will be described. Description common to the first to third embodiments will be omitted. The fourth embodiment relates to a method for obtaining the first and second thresholds δ1 and δ2.

The first and second thresholds δ1 and δ2 can be set to any values automatically or by user operation while the design rule (design layout) of the circuit pattern, a wafer process to be performed, and so forth are taken into consideration. Specifically, in a case where the circuit pattern to be formed is a gate pattern with a 45 nm half pitch and wafer magnification βx are taken as alignment measurement data, the thresholds δ1 and δ2 are set to 0.01 ppm and 0.005 ppm, respectively, as in the first embodiment. In a case where residual variances are taken as alignment measurement data as in the second embodiment, the thresholds δ1 and δ2 are set to 0.6 nm and 0.4 nm, respectively. The thresholds δ1 and δ2 may be either the same or different from each other.

Alternatively, the first and second thresholds δ1 and δ2 may be determined in accordance with the reproducibility of AGA measurement. In such a case, alignment is performed in accordance with the result of checking whether or not the absolute value of the difference between pieces of alignment measurement data obtained for the respective layers is larger than the corresponding threshold determined by the reproducibility of AGA measurement.

The reproducibility of AGA measurement will be described. In AGA, six parameters of Sx, Sy, βx, βy, θx, and θy are calculated from measurements of alignment mark positions in several sample shots, as described above. Even if there are no wafer-induced errors in the measurements of alignment mark positions for the sample shots, measurement errors may occur depending on stage position accuracy and errors in an alignment detection mechanism, for example. This means that the six parameters obtained in AGA may include such measurement errors.

In the fourth embodiment, such a measurement error resulting from AGA is defined as an AGA measurement reproducibility a. Specifically, the following case is considered: A result (M01) of AGA obtained by measuring the first alignment mark A1 in the first layer through the first second layer shows a variance of ±a, and a result (M12) of AGA obtained by measuring the second alignment mark A2 in the second layer through the second second layer also shows a variance of ±a. In this case, a result (M02) of AGA obtained by measuring the first alignment mark A1 in the first layer through the second second layer shows a variance of ±√2a. This is because the measurement for the result M02 is performed on the basis of indirect alignment and therefore the accuracy is reduced resulting in an increase in the reproducibility variance √2 times larger than those for the results M01 and M12.

In view of such circumstances, in the fourth embodiment, it is simple to set the first threshold δ1 to the maximum value of |M12−M01|, i.e., 2a. If |M12−M01| is 2a or smaller, it is considered that the error in the alignment performed in accordance with the result M12 is smaller than or equal to the error due to the AGA measurement reproducibility. If |M12−M01| is larger than 2a, it is considered that the error in the alignment performed in accordance with the result M12 includes an error other than the error due to the AGA measurement reproducibility, i.e., an error due to the wafer process. In such a case, another accuracy comparison can be performed in step S200.

In the fourth embodiment, it is simple to set the second threshold δ2 to the maximum value of |M02−M01|, i.e., $(1+\sqrt{2})a$. If |M02−M01| is $(1+\sqrt{2})a$ or smaller, it is considered that the error in the alignment performed in accordance with the result M02 is smaller than or equal to the error due to the AGA measurement reproducibility. If |M02−M01| is larger than $(1+\sqrt{2})a$, it is considered that the error in the alignment performed in accordance with the result M02 includes an error other than the error due to the AGA measurement reproducibility, i.e., an error due to the wafer process. In such a case, it is better to perform alignment in accordance with the result M12.

Fifth Embodiment

Next, a fifth embodiment of the present invention will be described. Description common to the first to fourth embodiments will be omitted. The fifth embodiment relates to a pattern forming method.

In the first to fourth embodiments, referring to FIG. 9, the second layer 230 serves as the target layer. Etching is performed on the target layer, whereby the first pattern is obtained. Then, alignment of the substrate is performed by any of the methods described above. Subsequently, after the second exposure, development, and etching, the second pattern is obtained in the target layer. In short, the first pattern and the second pattern are sequentially and separately formed in the target layer.

In the fifth embodiment, referring to FIG. 14, the second layer serves as a hard mask layer, and the target layer (a layer in which a desired pattern is to be provided) is disposed between the first layer and the second layer. First of all, first exposure is performed on the resist, the resist is developed, and the hard mask layer is etched, whereby a first pattern is obtained. Then, alignment of the substrate is performed by any of the methods described above. Further, after second exposure, development, and etching, a second pattern is obtained in the hard mask layer. Subsequently, the target layer disposed between the first layer and the second layer is etched, whereby the first pattern and the second pattern are obtained simultaneously in the target layer. In short, the first and second patterns are sequentially and separately formed in the hard mask layer but are simultaneously formed in the target layer.

Any of the above-described alignment methods can also be applied to the fifth embodiment. Therefore, according to the fifth embodiment, highly accurate substrate alignment is realized in double patterning. Moreover, process-induced errors can be reduced, whereby more highly accurate substrate alignment is realized. Consequently, pattern shifts occurring in forming patterns can be reduced.

Sixth Embodiment

Next, a method for manufacturing a device (such as a semiconductor integrated circuit device or a liquid crystal display device) by using an exposure apparatus to which any of the above-described alignment methods can be applied will be described. The device is manufactured using the exposure apparatus through the steps of exposing to light a substrate (such as a wafer or a glass substrate), over which a resist is applied, developing the substrate (the resist), and other known steps (such as etching, removal of the resist, dicing, bonding, and packaging). This method enables manufacture of a device of higher quality than in the known art.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-304503 filed on Nov. 26, 2007, which is hereby incorporated by reference herein in its entirety.

What is claimed is:

1. An alignment method in which alignment of a substrate including a first layer having a first alignment mark and a second layer overlying the first layer and having both a first pattern and a second alignment mark is performed in forming a second pattern in the second layer, the method comprising:

storing first alignment measurement data to be used in alignment performed in forming both the first pattern and the second alignment mark in the second layer, the first alignment measurement data obtained by measuring the first alignment mark;

obtaining second alignment measurement data by measuring the second alignment mark through a resist applied over the second layer;

making a first comparison of a first difference between the first alignment measurement data and the second alignment measurement data with a first threshold;

in response to the first difference being larger than the first threshold, making a second comparison of a second difference between the first alignment measurement data and third alignment measurement data with a second threshold, the third alignment measurement data obtained by measuring the first alignment mark through the resist applied over the second layer; and performing alignment of the substrate in accordance with the third alignment measurement data in response to the first difference being larger than the first threshold and the second difference being smaller than the second threshold, or in accordance with the second alignment measurement data in response to the first difference being smaller than or equal to the first threshold or the second difference being larger than or equal to the second threshold.

2. An alignment method in which alignment of a substrate including a first layer having a first alignment mark and a second layer overlying the first layer and having both a first pattern and a second alignment mark is performed in forming a second pattern in the second layer, the method comprising:

storing first alignment measurement data to be used in alignment performed in forming both the first pattern and the second alignment mark in the second layer, the first alignment measurement data obtained by measuring the first alignment mark;

obtaining second alignment measurement data and third alignment measurement data by measuring the second alignment mark and the first alignment mark, respectively, through a resist applied over the second layer;

making a first comparison of a first difference between the first alignment measurement data and the second alignment measurement data with a first threshold;

in response to the first difference being larger than the first threshold, making a second comparison of a second difference between the first alignment measurement data and third alignment measurement data with a second threshold; and performing alignment of the substrate in accordance with the third alignment measurement data in response to the first difference being larger than the first threshold and the second difference being smaller than the second threshold, or in accordance with the second alignment measurement data in response to the first difference being smaller than or equal to the first threshold or the second difference being larger than or equal to the second threshold.

3. The alignment method according to claim 1, wherein the first to third alignment measurement data are obtained in global alignment and each include data indicating magnification or an amount of rotation of the substrate.

4. The alignment method according to claim 1, wherein the first to third alignment measurement data are obtained for a plurality of shots of the substrate taken in global alignment and each include data indicating a residual for each of the shots or a residual variance among all of the shots.

5. The alignment method according to claim 1, wherein the first to third alignment measurement data each include data indicating asymmetry of a signal waveform of a corresponding one of the first and second alignment marks.

6. The alignment method according to claim 1, wherein the first and second thresholds are determined in accordance with a design layout of the first and second patterns.

7. The alignment method according to claim 1, wherein, when a reproducibility of measurement in global alignment is denoted as a, the first threshold is represented by 2a and the second threshold is represented by $(1+\sqrt{2})a$.

8. An exposure method using the alignment method according to claim 1 comprising:
performing alignment of a substrate by the alignment method according to claim 1; and
forming a latent image on the resist applied over the substrate by exposing the resist to light after performing the alignment, the latent image formed for forming the second pattern.

9. A pattern forming method using the exposure method according to claim 8 comprising:
exposing a resist applied over a substrate to light by the exposure methodaccording to claim 8;
developing the resist exposed to light; and
forming the second pattern in the second layer by etching the second layer after developing the resist.

10. A pattern forming method using the exposure method according to claim 8 comprising:
exposing a resist applied over a substrate to light by the exposure method according to claim 8;
developing the resist exposed to light;
forming the second pattern in the second layer by etching the second layer after developing the resist; and
forming the first pattern and the second pattern simultaneously in a target layer by etching the target layer after forming the second pattern, the target layer disposed between the first layer and the second layer.

11. An alignment method in which alignment of a substrate including a first layer having a first alignment mark and a second layer overlying the first layer and having both a first pattern and a second alignment mark is performed in forming a second pattern in the second layer, the method comprising:
storing first alignment measurement data to be used in alignment performed in forming both the first pattern and the second alignment mark in the second layer, the first alignment measurement data obtained by measuring the first alignment mark;
obtaining second alignment measurement data by measuring the second alignment mark through a resist applied over the second layer;
obtaining third alignment measurement data by measuring the first alignment mark through the resist applied over the second layer; and
performing alignment of the substrate in accordance with a difference between the first alignment measurement data and the second alignment measurement data, or in accordance with both the difference between the first alignment measurement data and the second alignment measurement data and a difference between the first alignment measurement data and the third alignment measurement data.

12. An exposure method using the alignment method according to claim 2 comprising:
performing alignment of a substrate by the alignment method according to claim 2; and
forming a latent image on the resist applied over the substrate by exposing the resist to light after performing the alignment, the latent image formed for forming the second pattern.

13. A pattern forming method using the exposure method according to claim 12 comprising:
exposing a resist applied over a substrate to light by the exposure method according to claim 12;
developing the resist exposed to light; and
forming the second pattern in the second layer by etching the second layer after developing the resist.

14. A pattern forming method using the exposure method according to claim 12 comprising:
exposing a resist applied over a substrate to light by the exposure method according to claim 12;
developing the resist exposed to light;
forming the second pattern in the second layer by etching the second layer after developing the resist; and
forming the first pattern and the second pattern simultaneously in a target layer by etching the target layer after forming the second pattern, the target layer disposed between the first layer and the second layer.

15. An exposure method using the alignment method according to claim 11 comprising:
performing alignment of a substrate by the alignment method according to claim 11; and
forming a latent image on the resist applied over the substrate by exposing the resist to light after performing the alignment, the latent image formed for forming the second pattern.

16. A pattern forming method using the exposure method according to claim 15 comprising:
exposing a resist applied over a substrate to light by the exposure method according to claim 15;
developing the resist exposed to light; and
forming the second pattern in the second layer by etching the second layer after developing the resist.

17. A pattern forming method exposure method according to claim 15 comprising:
exposing a resist applied over a substrate to light by the exposure method according to claim 15;
developing the resist exposed to light;
forming the second pattern in the second layer by etching the second layer after developing the resist; and
forming the first pattern and the second pattern simultaneously in a target layer by etching the target layer after forming the second pattern, the target layer disposed between the first layer and the second layer.

* * * * *